(12) United States Patent
Wang

(10) Patent No.: US 12,176,406 B2
(45) Date of Patent: Dec. 24, 2024

(54) TRENCH MOSFET AND METHOD FOR MANUFACTURING THE SAME

(71) Applicant: Hangzhou Silicon-Magic Semiconductor Technology Co., Ltd., Hangzhou (CN)

(72) Inventor: Jiakun Wang, Hangzhou (CN)

(73) Assignee: Hangzhou Silicon-Magic Semiconductor Technology Co., Ltd, Hangzhou (CN)

(*) Notice: Subject to any disclaimer, the term of this patent is extended or adjusted under 35 U.S.C. 154(b) by 674 days.

(21) Appl. No.: 17/113,305

(22) Filed: Dec. 7, 2020

(65) Prior Publication Data

US 2021/0184009 A1   Jun. 17, 2021

(51) Int. Cl.
| | | |
|---|---|---|
| H01L 29/423 | (2006.01) | |
| H01L 29/40 | (2006.01) | |
| H01L 29/417 | (2006.01) | |
| H01L 29/66 | (2006.01) | |
| H01L 29/78 | (2006.01) | |

(52) U.S. Cl.
CPC ........ H01L 29/4236 (2013.01); H01L 29/401 (2013.01); H01L 29/41775 (2013.01); H01L 29/66477 (2013.01); H01L 29/7841 (2013.01)

(58) Field of Classification Search
CPC ............... H01L 29/4236; H01L 29/401; H01L 29/41775; H01L 29/66477; H01L 29/7841; H01L 29/0878; H01L 29/41766; H01L 29/407; H01L 29/66734; H01L 29/7813; H01L 29/78; H01L 29/0603; H01L 29/0684; H01L 29/66727
See application file for complete search history.

(56) References Cited

U.S. PATENT DOCUMENTS

| | | | | |
|---|---|---|---|---|
| 6,573,561 B1 * | 6/2003 | Chidambarrao | ..... | H10B 12/053 257/329 |
| 6,921,697 B2 * | 7/2005 | Darwish | ........... | H01L 29/66734 257/329 |
| 7,772,668 B2 * | 8/2010 | Pan | ..................... | H01L 29/7813 257/E29.257 |

(Continued)

FOREIGN PATENT DOCUMENTS

| CN | 107170801 A | 9/2017 |
|---|---|---|
| CN | 109148587 A | 1/2019 |

OTHER PUBLICATIONS

CN 201911301611.9 First Office Action mailed Jun. 21, 2022.
CN 201911301611.9 Second Office Action mailed Nov. 22, 2022.

*Primary Examiner* — Maliheh Malek
(74) *Attorney, Agent, or Firm* — Osha Bergman Watanabe & Burton LLP

(57) ABSTRACT

A trench MOSFET can include: a semiconductor layer having a first doping type; a trench extending from an upper surface of the semiconductor layer to internal portion of the semiconductor layer; insulating layers and electrode conductors located in the trench; a body region having a second doping type in an upper region of the semiconductor layer adjacent to the trench; and a floating region having the first doping type located in a predetermined position of the semiconductor layer adjacent to both sides of the trench, where the floating region is located below the body region and is separated from the body region.

7 Claims, 3 Drawing Sheets

(56) References Cited

U.S. PATENT DOCUMENTS

| | | | |
|---|---|---|---|
| 7,923,772 B2* | 4/2011 | Mauder | H01L 29/7813 257/330 |
| 8,304,329 B2* | 11/2012 | Zeng | H01L 29/407 438/514 |
| 8,354,711 B2* | 1/2013 | Zeng | H01L 29/0878 257/341 |
| 8,372,717 B2* | 2/2013 | Hsieh | H01L 29/66734 438/270 |
| 8,614,759 B2* | 12/2013 | Watanabe | H01L 27/14603 348/308 |
| 8,716,792 B2* | 5/2014 | Mauder | H01L 29/36 257/329 |
| 8,829,641 B2* | 9/2014 | Marchant | H01L 29/7813 257/E29.066 |
| 8,860,130 B2* | 10/2014 | Hebert | H01L 29/7813 257/341 |
| 8,907,394 B2* | 12/2014 | Hossain | H01L 29/42376 257/302 |
| 9,178,027 B1* | 11/2015 | Zitouni | H01L 29/063 |
| 9,312,381 B1* | 4/2016 | Bobde | H01L 29/4175 |
| 9,478,621 B2* | 10/2016 | Akagi | H01L 29/404 |
| 9,502,554 B2* | 11/2016 | Bobde | H01L 29/66727 |
| 9,812,563 B2* | 11/2017 | Siemieniec | H01L 29/0878 |
| 10,008,579 B2* | 6/2018 | Calafut | H01L 29/7811 |
| 10,388,783 B2* | 8/2019 | Rankila | H01L 29/407 |
| 10,720,524 B1* | 7/2020 | Qiao | H01L 29/42376 |
| 11,398,561 B2* | 7/2022 | Cai | H01L 29/7813 |
| 11,424,344 B2* | 8/2022 | Wang | H01L 29/66734 |
| 2002/0185679 A1* | 12/2002 | Baliga | H01L 29/407 257/329 |
| 2007/0131987 A1* | 6/2007 | Kim | H01L 27/14647 257/E27.131 |
| 2008/0265315 A1* | 10/2008 | Mauder | H01L 29/7813 257/E29.066 |
| 2009/0206924 A1* | 8/2009 | Zeng | H01L 29/7811 257/330 |
| 2011/0136310 A1* | 6/2011 | Grivna | H01L 29/407 438/270 |
| 2011/0169103 A1* | 7/2011 | Darwish | H01L 29/0696 257/E29.262 |
| 2012/0032261 A1* | 2/2012 | Hsieh | H01L 29/0696 257/334 |
| 2012/0064684 A1* | 3/2012 | Hsieh | H01L 29/0634 438/270 |
| 2012/0074489 A1* | 3/2012 | Hsieh | H01L 29/0634 257/330 |
| 2012/0080748 A1* | 4/2012 | Hsieh | H01L 29/66734 257/E21.409 |
| 2012/0187474 A1* | 7/2012 | Rexer | H01L 29/66727 438/270 |
| 2013/0075810 A1* | 3/2013 | Hsieh | H01L 27/0255 257/328 |
| 2013/0248982 A1* | 9/2013 | Grivna | H01L 29/7848 257/329 |
| 2013/0256786 A1* | 10/2013 | Hsieh | H01L 29/0878 438/270 |
| 2013/0299901 A1* | 11/2013 | Hsieh | H01L 29/7803 438/270 |
| 2014/0048872 A1* | 2/2014 | Hsieh | H01L 29/1095 438/270 |
| 2014/0054682 A1* | 2/2014 | Padmanabhan | H01L 29/407 438/270 |
| 2014/0124855 A1* | 5/2014 | Hebert | H01L 29/0623 257/334 |
| 2014/0151788 A1* | 6/2014 | Burke | H01L 29/1095 257/330 |
| 2014/0159149 A1* | 6/2014 | Hsieh | H01L 29/0623 257/331 |
| 2014/0284710 A1* | 9/2014 | Hossain | H01L 29/7813 257/330 |
| 2015/0061002 A1* | 3/2015 | Tong | H01L 29/41766 438/270 |
| 2015/0118810 A1* | 4/2015 | Bobde | H01L 29/0623 438/270 |
| 2015/0372131 A1* | 12/2015 | Hébert | H01L 29/1095 257/329 |
| 2016/0020288 A1* | 1/2016 | Deng | H01L 29/7397 257/330 |
| 2016/0056138 A1* | 2/2016 | Shibib | H01L 27/0629 257/48 |
| 2016/0064478 A1* | 3/2016 | Sun | H01L 29/0634 257/493 |
| 2017/0040447 A1* | 2/2017 | Deng | H01L 29/7397 |
| 2017/0194485 A1* | 7/2017 | Smith | H01L 29/66734 |
| 2019/0123136 A1* | 4/2019 | Lee | H01L 21/324 |
| 2019/0206988 A1* | 7/2019 | Padmanabhan | H01L 29/7813 |
| 2019/0273152 A1* | 9/2019 | Yilmaz | H01L 29/1095 |
| 2019/0273157 A1* | 9/2019 | Yilmaz | H01L 29/66727 |
| 2020/0343370 A1* | 10/2020 | Cai | H01L 29/407 |
| 2020/0388671 A1* | 12/2020 | Takemoto | H01L 29/66734 |
| 2021/0020776 A1* | 1/2021 | Hsieh | H01L 23/544 |
| 2021/0028305 A1* | 1/2021 | Hsieh | H01L 29/66734 |
| 2021/0159324 A1* | 5/2021 | Wang | H01L 29/407 |
| 2021/0384346 A1* | 12/2021 | Hsieh | H01L 29/0634 |
| 2022/0069073 A1* | 3/2022 | Su | H01L 29/7813 |
| 2022/0181484 A1* | 6/2022 | Wu | H01L 29/401 |
| 2022/0216313 A1* | 7/2022 | Murasaki | H01L 29/7397 |
| 2023/0065526 A1* | 3/2023 | Wang | H01L 29/401 |
| 2023/0072989 A1* | 3/2023 | Nagata | H01L 29/404 |
| 2023/0100800 A1* | 3/2023 | Yilmaz | H01L 29/1095 257/288 |
| 2023/0197845 A1* | 6/2023 | Takizawa | H01L 29/1095 257/330 |
| 2023/0207684 A1* | 6/2023 | Cai | H01L 29/407 257/330 |
| 2023/0207685 A1* | 6/2023 | Cai | H01L 29/401 257/330 |

* cited by examiner

TRENCH MOSFET AND METHOD FOR MANUFACTURING THE SAME

RELATED APPLICATIONS

This application claims the benefit of Chinese Patent Application No. 201911301611.9, filed on Dec. 17, 2019, which is incorporated herein by reference in its entirety.

FIELD OF THE INVENTION

The present invention generally relates to semiconductor technology, and more particularly to trench MOSFETs, and methods for manufacturing trench MOSFETs.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Figure 1:
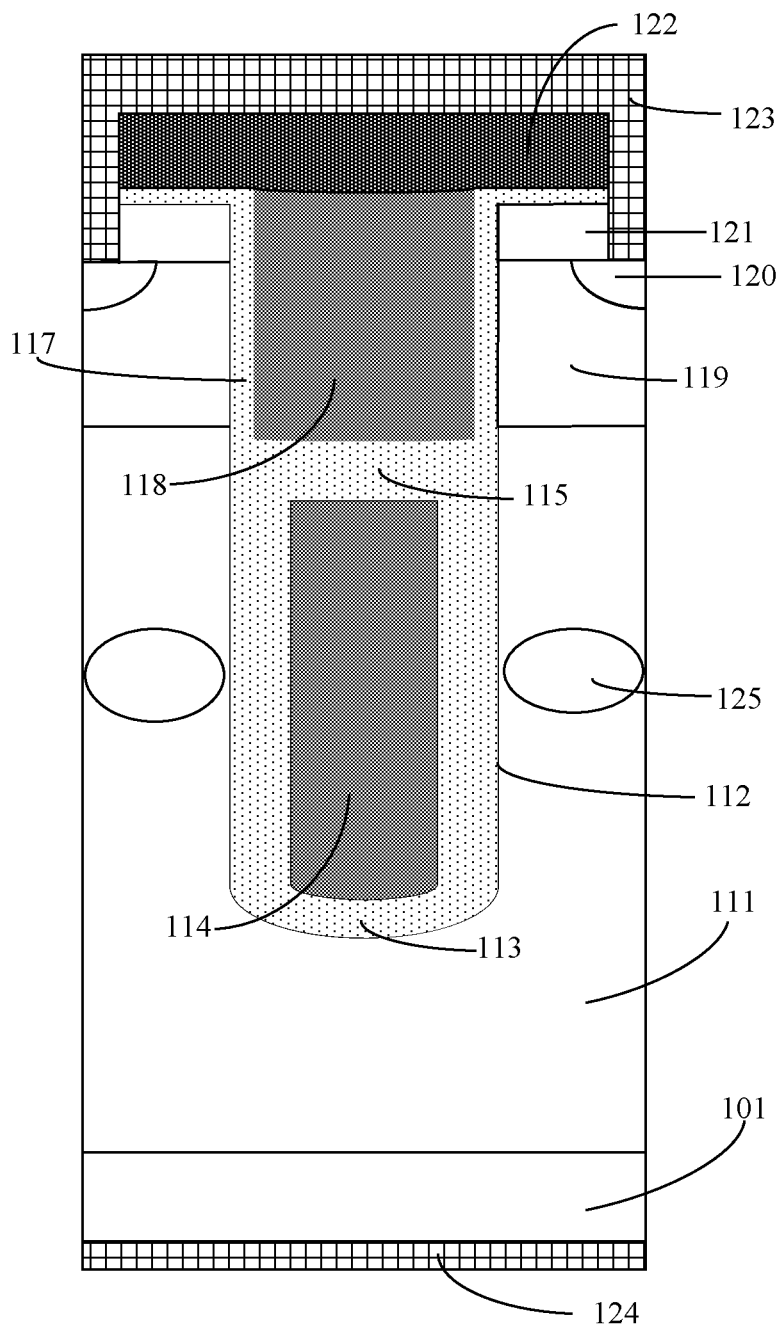
FIG. 1 is cross-sectional view diagram of a first example trench MOSFET, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Metal-oxide-semiconductor field-effect transistors (MOSFETs) have been widely used as power semiconductor devices, such as switches of power converters. A variety of different device structures and methods have been used by the semiconductor industry to form MOSFETs. In a shielded gate trench MOSFET, as compared to a typical MOSFET, the shield electrode may reduce the gate-drain capacitance and increase the cut-off voltage of the transistor. The gate electrode and the shield electrode may be insulated from each other by an inter-electrode dielectric (IED). The IED may have sufficient mass and thickness to support the potential difference between the shield electrode and the gate electrode. In addition, the interface well charge and the dielectric well charge at the interface between the shield electrode and the IED layer, and in the IED layer, are primarily related to the method of forming the IED layer. In traditional trench MOSFET devices, one problem is mutual restriction between breakdown voltage and on-resistance. Typically, the increase in breakdown voltage and the reduction in on-resistance may not be achieved at the same time, which can cause energy loss when the device is operating at a relatively high voltage.

Unless the context clearly indicates otherwise, each part of the semiconductor device can be made of material(s) well known to one skilled person in the art. For example, the semiconductor material includes group III-V semiconductors, such as GaAs, InP, GaN, and SiC, and/or group IV semiconductors, such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, $Ni_3Si$, Pt, Ru, W, and their combinations. A gate dielectric may be made of $SiO2$ or any material having dielectric constant larger than that of $SiO2$. For example, the gate dielectric may be made of one selected from a group consisting of oxides, nitrides, oxynitrides, silicates, aluminates, and titanates. Moreover, the gate dielectric can be made of those developed in the future, besides the above known materials.

In one embodiment, a trench MOSFET can include: (i) a semiconductor layer having a first doping type; (ii) a trench extending from an upper surface of the semiconductor layer to internal portion of the semiconductor layer; (iii) insulating layers and electrode conductors located in the trench; (iv) a body region having a second doping type in an upper region of the semiconductor layer adjacent to the trench; and (v) a floating region having the first doping type located in a predetermined position of the semiconductor layer adjacent to both sides of the trench, where the floating region is located below the body region and is separated from the body region.

Referring now to FIG. 1, shown is cross-sectional view diagram of a first example trench MOSFET, in accordance with embodiments of the present invention. In this application, the semiconductor layer is of a first doping type, where the first doping type is one of N type and P type, and a second doping type is the other one of the N type and P type. In order to form an N-type semiconductor layer or region, an N-type dopant (e.g., P, As) can be doped in the semiconductor layer or region. In order to form a P-type semiconductor layer or region, a P-type dopant (e.g., B) can be doped in the semiconductor layer and region. For example, the semiconductor layer is N-type doped.

The trench MOSFET can include semiconductor substrate 101 and semiconductor layer 111 on semiconductor substrate 101. In this example, semiconductor layer 111 is configured as the epitaxial semiconductor layer, and semiconductor substrate 101 is N-type doped. Epitaxial semiconductor layer 111 may be on a surface of semiconductor substrate 101 opposite to that of drain electrode 124 (e.g., the first surface of semiconductor substrate 101). For example, Epitaxial semiconductor layer 111 can include silicon. Epitaxial semiconductor layer 111 may be a lightly doped layer relative to semiconductor substrate 101. The second surface of semiconductor substrate 101 can be thinned by a thinning process, and drain electrode 124 may be formed on the second surface of semiconductor substrate 101. In some embodiments, a buffer layer may also be provided between semiconductor substrate 101 and epitaxial semiconductor layer 111, and the doping type of the buffer layer is the same as that of the semiconductor substrate to reduce the interface instability between the semiconductor substrate and the epitaxial semiconductor layer due to the defect of the semiconductor substrate.

The trench MOSFET can also include: trench 112 extending from an upper surface of epitaxial semiconductor layer 111 into its interior portion, insulating layers and electrode conductors located in the trench; body region 119 having a second doping type in an upper region of the semiconductor layer adjacent to the trench; and floating region 125 having the first doping type located in a predetermined position of the semiconductor layer adjacent to both sides of the trench. For example, the trench may end in epitaxial semiconductor layer 111. Floating region 125 can be located below body region 119 and may be separated from body region 119. Floating region 125 is not lower than a bottom surface of trench 112; that is, floating region 125 is located in the semiconductor layer between body region 119 and the bottom surface of trench 112.

For example, the insulating layers in the trench can include insulating layers 113, 117, and 115. Insulating layer 113 can cover a lower sidewall surface and the bottom surface of trench 112, insulating layer 117 can cover a upper sidewall surface of trench 112, and insulating layer 115 may be located between insulating layer 113 and insulating layer 117, where the thickness of insulating layer 113 is greater than the thickness of insulating layer 117. The electrode conductors in the trench can include conductor 114 located in the lower part of trench 112, and conductor 118 located in the upper part of trench 112. For example, insulating layer 113 may separate conductor 114 from epitaxial semiconductor layer 111, and insulating layer 117 may separate conductor 118 from epitaxial semiconductor layer 111. In this example, conductor 114 can be a shielded conductor, conductor 118 can be a gate conductor, and insulating layer 117 can be a gate dielectric layer. Insulating layer 115 may the shielded conductor and the gate conductor. For example, a junction depth of body region 119 may not exceed a depth of gate conductor 118 extending in the trench. In addition, floating region 125 may be arranged not higher than the upper surface of conductor 114, and not lower than the lower surface of conductor 114.

The trench MOSFET can also include source region 121 of the first doping type, body contact region 120 of the second doping type, and interlayer dielectric layer 122. Source region 121 may be formed in body region 119, body contact region 120 may be formed in body region 119, interlayer dielectric layer 122 may be formed above source region 121 and gate conductor 118, and interlayer dielectric layer 122 may at least fully cover the trench. A conductive channel that penetrates interlayer dielectric layer 122 and source region 121 to reach body contact region 120 may be formed adjacent to source region 121. Source electrode 123 may be formed on interlayer dielectric layer 122, interlayer dielectric layer 122 fully covers the interlayer dielectric layer, and source electrode 123 may be connected to body contact region 120 via conductive channel. For example, interlayer dielectric layer 122 can be an oxide layer having a specific thickness (e.g., silicon oxide). Here, the second doping type is opposite to the first doping type, where the first doping type is one of N type and P type, and the second doping type is the other one of the N type and P type.

In this embodiment, the greater the doping concentration of the floating region, the greater the distance between the floating region and the bottom surface of the body region is set, and the greater the doping concentration of the floating region. Also, the greater the distance between the floating region and the bottom surface of the trench is set, which can reduce its influence on the doping concentration of the epitaxial semiconductor layer at the position where the electric field strength of the trench MOSFET is the greatest, thereby reducing its influence on the breakdown voltage of the trench MOSFET. For example, the positions where the electric field strength of the trench MOSFET is the largest are the bottom of the trench and the bottom of the body region. For example, the floating region is located at a center position between the bottom surface of the body region and the bottom surface of the trench. When the trench is a vertical trench, the distance between the upper surface of the floating region and the bottom surface of the body region may be equal to the distance between the lower surface of the floating region and the bottom surface of the trench. When the trench is an oblique angle trench (that is, a trapezoidal trench with a wide top and a narrow bottom), the distance between the upper surface of the floating region and the bottom surface of the body region is less than the distance between the bottom surface of the floating region and the bottom surface of the trench.

It should be noted that the floating region may or may not be in contact with the outer side surface of the trench, which is not limited here. For example, doping concentration range of the floating region may be 1e12-1e14 cm$^{-3}$, such as 1e13 cm$^{-3}$. In particular embodiments the on-resistance of the trench MOSFET can be reduced by providing a floating region of the first doping type in the semiconductor layer. In addition, by setting the position of the floating region, the floating region may have less influence on the breakdown voltage of the trench MOSFET. For example, the greater the doping concentration of the floating region, the greater the distance between the floating region and the bottom surface of the body region is set, and the greater the doping concentration of the floating region. Also, the greater the distance between the floating region and the bottom surface of the trench is set, which may reduce the influence on the doping concentration of the semiconductor layer at the position where the electric field intensity of the trench MOSFET is the greatest, thereby reducing its influence on the breakdown voltage of the trench MOSFET.

Figure 2:
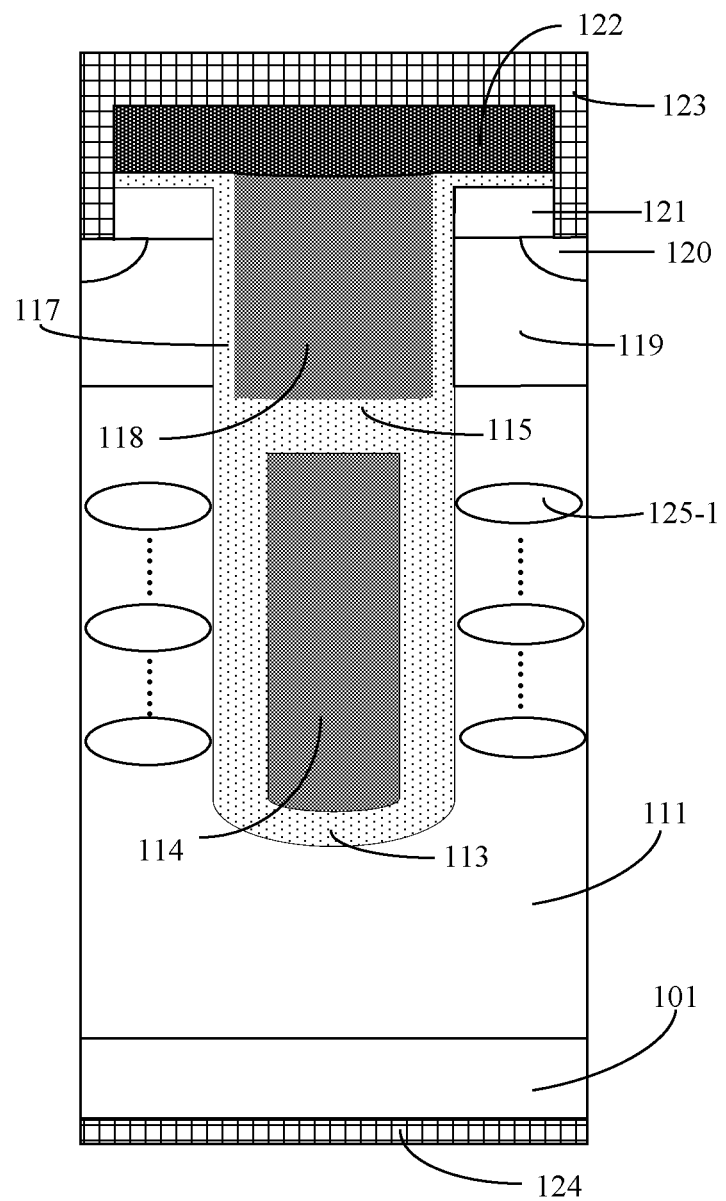
FIG. 2 is cross-sectional view diagram of a second example trench MOSFET, in accordance with embodiments of the present invention.

Referring now to FIG. 2, shown is cross-sectional view diagram of a second example trench MOSFET, in accordance with embodiments of the present invention. In this particular example, the floating region can include at least two sub-floating regions 125-1, and the sub-floating regions 125-1 may be sequentially arranged along the longitudinal direction of the trench MOSFET structure. The plurality of sub-floating regions 125-1 may or may not be separated from each other. Generally, the higher the breakdown voltage of the trench MOSFET, the deeper the depth of the trench, and the more the amount of sub-floating regions can be set. For example, the doping concentrations of the sub-floating regions can all be set to be consistent (e.g., the same). In other examples, the smaller the distance between the sub-floating region and the bottom surface of the body region, the lower the doping concentration of the sub-floating region can be set. In addition, the smaller the distance between the sub-floating region and the bottom surface of the trench, the lower the doping concentration of the sub-floating region can be set. In this example, the amount of the sub-floating regions 125-1 is not limited to those shown in FIG. 2, and those skilled in the art will recognize that the amount of the floating regions can be set according to the doping concentration of the floating region, the voltage requirements and on-resistance requirements of the device, and so on.

Figure 3:
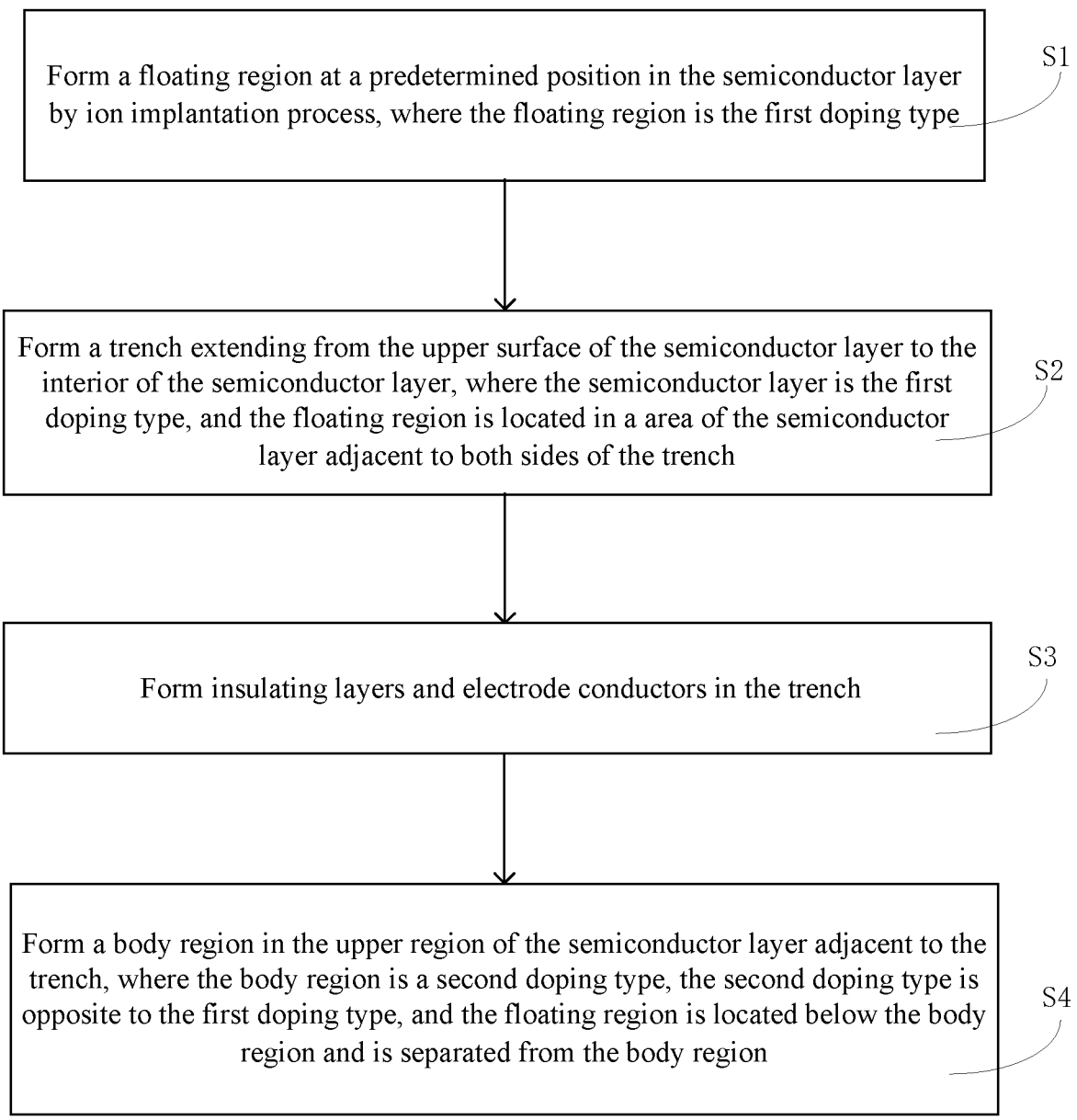
FIG. 3 is a flow diagram of an example method of manufacturing a trench MOSFET, in accordance with embodiments of the present invention.

Referring now to FIG. 3, shown is a flow diagram of an example method of manufacturing a trench MOSFET, in accordance with embodiments of the present invention. At S1, a floating region may be formed at a predetermined position in the semiconductor layer by ion implantation process, and the floating region is the first doping type. At S2, a trench extending from the upper surface of the semiconductor layer to the interior of the semiconductor layer may be formed, the semiconductor layer is the first doping type, and the floating region can be located in an area of the semiconductor layer adjacent to both sides of the trench. At S3, insulating layers and electrode conductors may be formed in the trench. At S4, a body region may be formed in the upper region of the semiconductor layer adjacent to the trench, and the body region is a second doping type, where the second doping type is opposite to the first doping type. The floating region can be located below the body region and is separated from the body region, and the floating region is not lower than the bottom surface of the trench.

For example, in S1, an first oxide layer can be grown on the upper surface of the semiconductor layer, and then the floating region may be formed by ion implantation process at a predetermined position in the semiconductor layer. The first oxide layer can protect the upper surface of the semiconductor layer during ion implantation process, and the first oxide layer may be removed after forming the floating region.

The greater the implantation energy of the floating region, the deeper the depth of the floating region in the semiconductor layer. For example doping concentration range of the floating region is 1e12-1e14 cm$^3$. In other examples, the floating region may include at least two sub-floating regions, and the sub-floating regions can be formed in turn by ion implantation process along the direction from the lower surface of the semiconductor layer to the upper surface thereof, where the implantation energy of the sub-floating region decreases in turn along the direction from the lower surface of the semiconductor layer to the upper surface thereof.

As shown in FIG. 1, in S2, the trench MOSFET can include semiconductor substrate 101 and semiconductor layer 111 formed on semiconductor substrate 101. The semiconductor layer may be configured as a epitaxial semiconductor layer. A second oxide layer may be formed on epitaxial semiconductor layer 111, and a photoresist layer can be formed on the second oxide layer. Then, an etching process may be performed, which can be dry etching (e.g., ion milling etching, plasma etching, reactive ion etching, laser ablation, etc.), or selective wet etching using an etching solution. A process of etching downward from the opening of the photoresist layer can be performed to form an opening of the second oxide layer, whereby the second oxide layer is patterned to be configured as a first hard mask. The etching can be stopped on the upper surface of epitaxial semiconductor layer 111 according to the selected etching process. After the first hard mask is formed, the photoresist layer may be removed, such as by dissolution in a solvent or ashing process.

Epitaxial semiconductor layer 111 can be further etched by the above-described etching process using a first hard mask to form trench 112 in epitaxial semiconductor layer 111. Trench 112 may extend from the upper surface of epitaxial semiconductor layer 111 into internal portion of epitaxial semiconductor layer 111. For example, the depth of trench 112 can be controlled by controlling the etching time. The trench may end inside epitaxial semiconductor layer 111. After the trench is formed, the first hard mask can be removed relative to the epitaxial semiconductor layer, such as by a selective etchant.

In S3, a first insulating layer and a first conductor may be formed in a lower part of the trench, the first insulating layer covers a lower sidewall surface and bottom surface of the trench and separates the first conductor from the semiconductor layer. Also, a third insulating layer may be formed on the first conductor, and a second insulating layer and a second conductor may be formed in an upper part of the trench. For example, the second insulating layer can cover an upper sidewall surface of the trench and separates the second conductor from the semiconductor layer. For example, the insulating layers can include first, second, and third insulating layers, and the electrode conductors can include the first and second conductors. In this example, the first conductor can be a shielded conductor, the second conductor can be a gate conductor, and the second insulating layer can be a gate dielectric layer.

For example, the first insulating layer may be formed along the internal surface of the trench and the upper surface of epitaxial semiconductor layer 111, such as by a thermal oxidation process or chemical vapor deposition process. The first insulating layer may cover the bottom surface and sidewall surfaces of the trench and the upper surface of epitaxial semiconductor layer. The first insulating layer can include of oxide or nitride (e.g., silicon oxide, silicon nitride, etc.). Subsequently, a shielded conductor is formed inside the trench and on the upper surface of epitaxial semiconductor layer 111 by low pressure chemical vapor deposition process. The first insulating layer may separate the shielded conductor from epitaxial semiconductor layer 111.

The shield conductor may be polished by a chemical mechanical polishing process (CMP). The shield conductor can be selectively etched back relative to first insulating layer such that shield conductor on the upper surface of epitaxial semiconductor layer 111 and occupying an upper part of the trench may be removed, the remaining shielded conductor in the lower part of the trench may be shielded conductor 114 in FIG. 1. For example, the etching back can be performed by a dry etching process. Shield conductor 114 can include doped polysilicon.

Subsequently, the first insulating layer may be selectively etched relative to epitaxial semiconductor layer 111 by the above-described known etching process. The first insulating layer on the upper surface of epitaxial semiconductor layer 111 and occupying the upper part of the trench may be removed (e.g., by a wet etching process), such that insulating layer 113 is located between sidewalls of the trench and shield conductor 114, and insulating layer 113 does not cover the top of shield conductor 114. For example, the upper surface of insulating layer 113 may be lower than the upper surface of shield conductor 114. The etching process can be wet etching. In other examples, the etching process here can be omitted, such that the first insulating layer and the subsequently formed third insulating layer form conformal, and then are etched together.

The third insulating layer may be formed on a top of shield conductor 114 and a top of insulating layer 113 by a plasma enhanced chemical vapor deposition process. The third insulating layer can cover the top of shield conductor 114 and the top of insulating layer 113, and may be located on the upper sidewall of the trench and the upper surface of epitaxial semiconductor layer 111. The first and third insulating layers may form conformal. The third insulating layer may be composed of oxide or nitride, e.g., silicon oxide or silicon nitride.

Subsequently, the third insulating layer on the upper surface of the epitaxial semiconductor layer may be removed by a CMP (chemical mechanical polishing) process, and then a BOE (buffered-oxide-etch, buffered oxide etching solution) solution is used to etch back the third insulating layer inside of the trench, such that a certain thickness of insulating layer 115 remains on top of shielding conductor 114. The third oxide layer (e.g., gate dielectric layer 117) can be formed on sidewall surface of the upper part of the trench, such as by a thermal oxidation process, such that upper sidewalls the trench are covered by gate dielectric layer 117. A thermal oxidation process may generally be used to react silicon with gases containing oxides, such as water vapor and oxygen, at high temperatures, and to produce a dense layer of silicon dioxide (SiO2) film on the surface of silicon wafer.

Further, polysilicon can fill up the trench covered with gate dielectric layer 117, such as by low pressure chemical vapor deposition process, in order to form gate conductor 118. Gate conductor 118 can include a first portion inside the trench and a second portion on the upper surface of epitaxial semiconductor layer. The second portion of gate conductor on the upper surface of epitaxial semiconductor layer may be removed by etching back or chemical mechanical planarization process, such that gate conductor 118 is located inside the trench and the top surface of gate conductor 118 is not higher than the opening of the trench. Alternatively, the conductor layer of gate conductor 118 may be selectively removed relative to epitaxial semiconductor layer 111, and the conductor layer can be etched back such that the top surface of gate conductor 118 is not higher than the upper surface of epitaxial semiconductor layer. Insulating layer 115 may insulate shield conductor 114 from gate conductor 118, and insulating layer 115 may have a certain mass and thickness to support the potential difference that may exist between shield conductor 114 and gate conductor 118.

At S4, a first ion implantation process and driving technique may be performed to form body region 119 of a second doping type in the upper region of epitaxial semiconductor layer 111 adjacent to the trench. Further, a second ion implantation process can be performed to form source region 121 of the first doping type in body region 119. The second doping type may be opposite to the first doping type. The desired doping depth and doping concentration can be achieved by controlling the parameters of the ion implantation process, such as the implantation energy and implantation dose. The depth of body region 119 may not exceed the extending depth of gate conductor 118 in the trench. The lateral extension of body region 119 and source region 121 can be controlled using an additional photoresist mask. For example, body region 119 and source region 121 may be adjacent to the trench, and respectively separated into two portions by gate conductor 118 and gate dielectric 117.

Subsequently, interlayer dielectric layer 122 can be formed above source region 121 and at least fully cover the trench, such as by the above-described deposition process, and chemical mechanical planarization may further be performed as necessary in order to obtain a flat surface. Interlayer dielectric layer 122 can cover the top surface of source region 121 and the top surface of gate conductor 118. The portion of the gate dielectric layer located on the upper surface of the epitaxial semiconductor layer can be removed by etching process after the source region is formed, or it can be selected not to be removed, and may be conformal to the interlayer dielectric layer 122. Body contact region 120 of the second doping type may be formed in body region 119, such as by the above-described etching process and an ion implantation process. A conductive channel penetrating interlayer dielectric layer 122 and source region 121 reaching body contact region 120 may be formed, such as by the above-described etching process. Source electrode 123 can be formed on interlayer dielectric layer 122 and fully cover the interlayer dielectric layer, and source electrode 123 may connect to body contact region 120 via the conductive channel.

Drain electrode 124 can be formed on the second surface of semiconductor substrate 101 thinned by a thinning technique, such as by the above-described deposition process. In the above example, conductive channel, source electrode 123, gate conductor 118, shield conductor 114, and drain electrode 124, may be formed by a conductive material, such as a metal material (e.g., an aluminum alloy, copper, etc.).

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A trench MOSFET, comprising:
    a) a semiconductor layer having a first doping type;
    b) a trench extending from an upper surface of the semiconductor layer to internal portion of the semiconductor layer;
    c) insulating layers and electrode conductors located in the trench;
    d) a body region having a second doping type located in an upper region of the semiconductor layer adjacent to the trench; and
    e) a floating region located below the body region and having the first doping type, wherein
        when the trench is a vertical trench, a greater doping concentration of the floating region provides a greater distance between an upper surface of the floating region and a bottom surface of the body region and a greater distance between a bottom surface of the floating region and a bottom surface of the trench, and
        when the trench is an oblique-angle trench, the distance between the upper surface of the floating region and the bottom surface of the body region is less than the distance between the bottom surface of the floating region and the bottom surface of the trench.

2. The trench MOSFET of claim 1, wherein the insulating layers in the trench comprise:
    a) a first insulating layer covering a lower sidewall surface and a bottom surface of the trench;
    b) a second insulating layer covering an upper sidewall surface of the trench;
    c) a third insulating layer located between the first insulating layer and the second insulating layer; and
    d) wherein the electrode conductors in the trench comprise a first conductor located in a lower part of the trench and a second conductor located in the upper part of the trench, the first insulating layer separates the first conductor from the semiconductor layer, the second insulating layer separates the second conductor from the semiconductor layer, a thickness of the first insulating layer is greater than a thickness of the second insulating layer, and the third insulating layer separates the first conductor from the second conductor.

3. The trench MOSFET of claim 1, wherein the floating region comprises at least two sub-floating regions, and the sub-floating regions are sequentially arranged along a longitudinal direction of the trench MOSFET.

4. The trench MOSFET of claim 3, wherein a deeper depth of the trench provides a greater amount of the sub-floating regions.

5. The trench MOSFET of claim 3, wherein doping concentrations of the sub-floating regions are consistent.

6. The trench MOSFET of claim 3, wherein:
a) a smaller distance between one of the two sub-floating regions and a bottom surface of the body region provides a lower doping concentration of the sub-floating region; and
b) a smaller distance between one of the two sub-floating regions and a bottom surface of the trench provides a lower doping concentration of the sub-floating region.

7. The trench MOSFET of claim 1, further comprising:
a) a source region having the first doping type and located in the body region;
b) an interlayer dielectric layer located on the source region, and at least fully covering the trench;
c) a source electrode located on the interlayer dielectric layer, and fully covering the interlayer dielectric layer;
d) a body contact region having the second doping type and located in the body region;
e) a conductive channel penetrating the interlayer dielectric layer and the source region to reach the body contact region; and
f) a drain electrode located under a lower surface of the semiconductor layer, wherein the source electrode is connected to the body contact region through the conductive channel.

* * * * *